(12) United States Patent
Onda

(10) Patent No.: US 9,277,659 B2
(45) Date of Patent: Mar. 1, 2016

(54) INFORMATION APPARATUS AND LINK MECHANISM OF INFORMATION APPARATUS

(71) Applicant: FUJITSU LIMITED, Kawasaki-shi, Kanagawa (JP)

(72) Inventor: Nobuhiko Onda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 301 days.

(21) Appl. No.: 13/934,826

(22) Filed: Jul. 3, 2013

(65) Prior Publication Data

US 2014/0043736 A1    Feb. 13, 2014

(30) Foreign Application Priority Data

Aug. 10, 2012    (JP) ................. 2012-178708

(51) Int. Cl.
*G06F 1/16* (2006.01)
*H05K 5/02* (2006.01)

(52) U.S. Cl.
CPC ............ *H05K 5/0217* (2013.01); *G06F 1/1681* (2013.01); *H05K 5/0221* (2013.01)

(58) Field of Classification Search
CPC .............. G06F 1/1616–1/1624; G06F 1/1681; F16M 2200/063
USPC ......................................... 361/679.26, 679.6
See application file for complete search history.

(56) References Cited

U.S. PATENT DOCUMENTS

| 6,233,138 | B1 * | 5/2001 | Osgood .................... 361/679.05 |
| 6,288,891 | B1 * | 9/2001 | Hasegawa et al. ....... 361/679.07 |
| 6,464,195 | B1 * | 10/2002 | Hildebrandt .................. 248/460 |
| 6,532,147 | B1 * | 3/2003 | Christ, Jr. ................. 361/679.27 |
| 6,912,121 | B2 * | 6/2005 | Karidis et al. ............ 361/679.06 |
| 7,061,753 | B2 * | 6/2006 | Michoux et al. .......... 361/679.05 |
| 7,630,193 | B2 * | 12/2009 | Ledbetter et al. ........ 361/679.21 |
| 7,974,084 | B2 * | 7/2011 | Chen et al. ............... 361/679.26 |
| 8,183,459 | B2 * | 5/2012 | Wei et al. ......................... 174/50 |
| 2009/0011802 | A1 | 1/2009 | Malthe et al. |
| 2010/0210328 | A1 | 8/2010 | Pirhttilahti et al. |

FOREIGN PATENT DOCUMENTS

| JP | 7-56653 | 3/1995 |
| JP | 11-24788 | 1/1999 |
| JP | 3102036 | 10/2000 |
| JP | 2008-533887 | 8/2008 |
| JP | 2010-508745 | 3/2010 |
| JP | 2010-87991 A | 4/2010 |

* cited by examiner

*Primary Examiner* — Anthony Q Edwards
(74) *Attorney, Agent, or Firm* — Fujitsu Patent Center

(57) ABSTRACT

A link mechanism which links a main body and a display part of an information apparatus with a display part which can be opened and closed with respect to a main body is made a four-section articulated link mechanism which arranges first and second joints on the main body and arranges third and fourth joints on the display part. The first joint is fixed in position, the second joint is made slidable with respect to the first joint, and the third and fourth joints are positioned at two ends of a slide block which can slide on the display part. Due to this, the four-section articulated link mechanism can make the display part simultaneously slide and tilt with respect to the main body from the closed position.

17 Claims, 9 Drawing Sheets

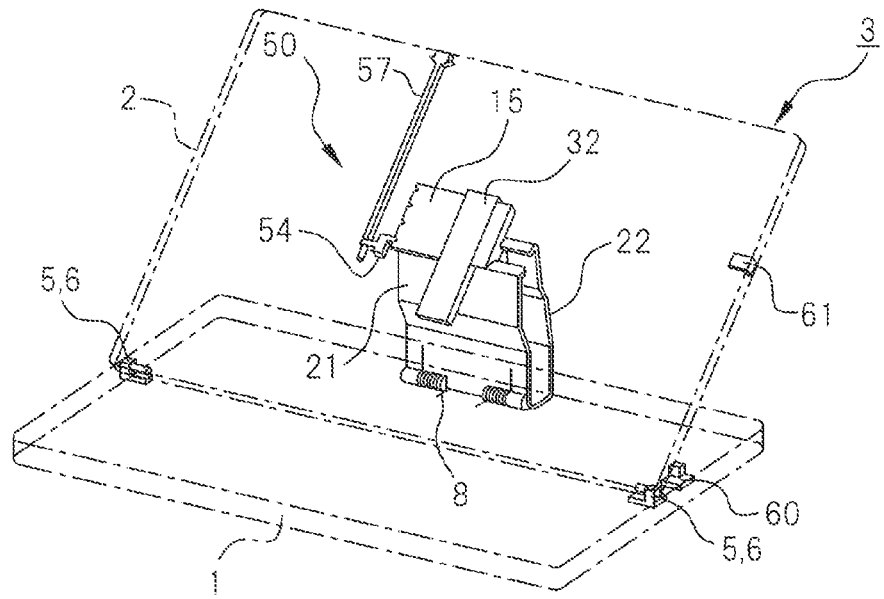
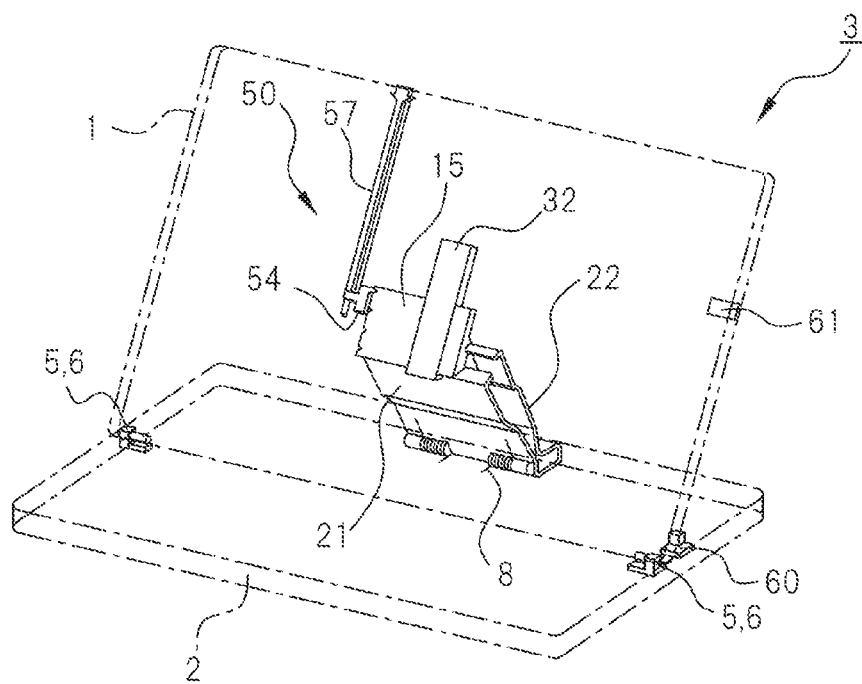

INFORMATION APPARATUS AND LINK MECHANISM OF INFORMATION APPARATUS

CROSS-REFERENCE TO RELATED APPLICATION

This application claims priority from, and incorporates by reference the entire disclosure of, Japanese Patent Application No. 2012-178708, filed on Aug. 10, 2012.

FIELD

The present application relates to an information apparatus which enables a display part to slide and simultaneously tilt with respect to a main body and to a link mechanism of an information apparatus.

BACKGROUND

Tablet type personal computers (hereinafter personal computers abbreviated as "PCs"), notebook type PCs, mobile phones, smart phones, and other information apparatuses are configured by a main body and a display part. In such information apparatuses, it is possible to change from a tablet PC style where the display part is laid over the main body to a notebook PC style by sliding and making the display part tilt with respect to the main body.

As comparative art of such an information apparatus, there is an information apparatus which is provided with a first housing (main body) and a second housing (display part) which are connected by an opening device configured by a slide mechanism and a tilt mechanism (for example, see Japanese Laid-Open Patent Publication No. 2010-87991A). Further, in the information apparatus which is disclosed in the comparative art, the second housing is made to move in parallel with the first housing and open by the slide mechanism from the state where the first housing and the second housing are superposed, then the tilt mechanism is used to make the second housing tilt with respect to the first housing.

SUMMARY

In this regard, in the information apparatus which is disclosed in Japanese Laid-Open Patent Publication No. 2010-87991A, the second housing is made to slide on the first housing, then tilt in a two-stage operation, so there is the issue that the feeling of operation from the closed state to the tilted state is not smooth. Furthermore, in the information apparatus which is disclosed in Japanese Laid-Open Patent Publication No. 2010-87991A, the tilt angle is constant, so there is the issue that it is not possible to change the tilt angle of the second housing with respect to the first housing in the tilted state. The operability as an information apparatus is not good.

In one aspect, the present application has as its object the provision of an information apparatus which is provided with a first housing and a second housing wherein it is possible to change from a state where the second housing is laid over the first housing to a tilted state by simultaneously performing a sliding operation and tilting operation of the second housing on the surface of the first housing. Further, in another aspect, it has as its object the provision of a link mechanism of an information apparatus which can simultaneously perform a sliding operation and a tilting operation of the second housing on the surface of the first housing to change to a tilted state, then change the tilt angle of the second housing with respect to the first housing.

According to one aspect of the present application, there is provided an information apparatus which is provided with a first housing, a second housing, and a four-section articulated link mechanism which links the first housing and the second housing, the four joints at the four-section articulated link mechanism including first and second joints which are provided at the first housing (1) and third and fourth joints which are provided at the second housing (2), the four-section articulated link mechanism able to change the positions of the four joints so as to change to any of the positions of a closed position where the second housing is laid over the first housing, an opened position after the second housing is slid from the closed position, then is arranged forming a certain tilt angle with respect to the first housing, and a plurality of open angle positions where the tilt angle of the second housing with respect to the first housing is changed from the opened position.

According to another aspect of the present application, there is provided a link mechanism which connects a first housing and a second housing in a slidable and tiltable manner, the link mechanism provided with first and second joints which are provided on the first housing, third and fourth joints which are provided on the second housing, a first link which bridges the first and third joints, a second link which bridges the second and fourth joints, and a slide block to the two ends of which the third and fourth joints are attached, the first joint being fixed in position on the first housing, the second joint being slidable with respect to the first joint, the slide block being slidable on the second housing, and the second link being longer than the first link.

BRIEF DESCRIPTION OF DRAWINGS

FIG. 6A is a perspective view which illustrates the state of a four-section articulated link mechanism at the time when the information apparatus finishes being slid and tilted from the state which is illustrated in FIG. 5A.

FIG. 6B is a perspective view which illustrates the state of a four-section articulated link mechanism at the time when the information apparatus is changed in tilt angle of the display part from the state which is illustrated in FIG. 6A.

DESCRIPTION OF EMBODIMENTS

Below, the attached drawings will be used to explain in detail embodiments of the information apparatus of the present application based on specific examples, but to clarify the configuration and operation of the information apparatus, first the link mechanism which is attached to the information apparatus will be explained. Further, the information apparatus which is covered by the present application can change the position of the second housing with respect to the first housing by a link mechanism. Here, the explanation will be given by taking as an example an information apparatus which can change the position of a second housing constituted by a display part with respect to a first housing constituted by a main body.

Figure 1A:
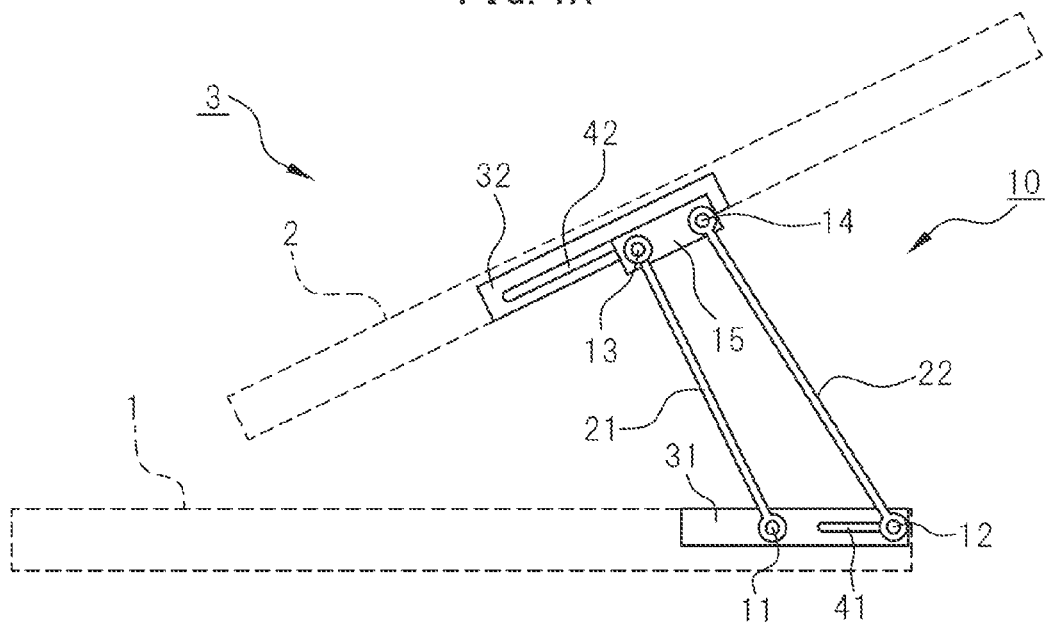
FIG. 1A is a side view which illustrates the configuration of a first embodiment of a four-section articulated link mechanism according to the present application and a mounting position to the first housing and the second housing.

FIG. 1A is a side view which illustrates the configuration of a first embodiment of a four-section articulated link mechanism 10 according to the present application. The four-section articulated link mechanism 10 changes the position of the second housing 2 (below, referred to as the "display part 2") with respect to the first housing 1 (below, referred to as the "main body 1"). FIG. 1A illustrates the configuration of the first embodiment of the four-section articulated link mechanism 10 and illustrates the mounting position of the four-section articulated link mechanism 10 to the main body 1 and the display part 2 by illustration of the main body 1 and the display part 2 by broken lines. Further, the information apparatus 3 is considered to be provided with the main body 1 and the display part 2, while the articulations at the four-section articulated link mechanism 10 are described as "joints".

The four-section articulated link mechanism 10 of the first embodiment is provided with a mounting plate 31 to the main body 1 (below, referred to as the "first mounting plate 31") and a mounting plate 32 to the display part 2 (below, referred to as the "second mounting plate 32"). The first mounting plate 31 is attached to a side surface at the back part of the main body 1, while the second mounting plate 32 is attached to a side surface at the center part of the display part 2. At the center part of the first mounting plate 31, a first joint 11 is provided. At a part of the first mounting plate 31 further to the rear from the center part, a groove 41 in which a second joint slides (below, referred to as the "first slide groove 41") is provided. The second joint 12 is provided inside the first slide groove 41 and can be slid to change the distance from the first joint 11.

The second mounting plate 32 is provided with a groove 42 in the longitudinal direction (below, referred to as the "second slide groove 42"). A slide block 15 which is provided with a predetermined length can be slid inside the second slide groove 42. Further, at the slide block 15, a third joint 13 and fourth joint 14 are provided fixed in position near the two end parts. Here, the joint at the bottom end side of the display part 2 is referred to as the "third joint 13" while the joint at the top end side of the display part 2 is referred to as the "fourth joint 14".

Further, a first link 21 bridges the first joint of the first mounting plate 31 and the third joint 13 at the slide block 15 which is provided at the second mounting plate 32. Further, a second link 22 bridges the second joint 12 at the first mounting plate 31 and the fourth joint 14 at the slide block 15 which is provided at the second mounting plate 32. Further, the length of the second link 22 is longer than the length of the first link 21. This is due to the following reason.

Figure 1B:
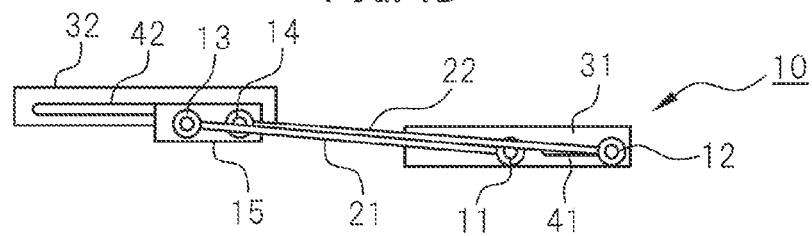
FIG. 1B is a side view which illustrates the state of the four-section articulated link mechanism which is illustrated in FIG. 1A when folded up.

In this embodiment, the maximum distance between the first and second joints 11 and 12 (distance at the time the second joint 12 is positioned at the end of the first slide groove 41) is longer than the distance (fixed) between the third and fourth joints 13 and 14. For this reason, when the four-section articulated link mechanism 10 is operated as illustrated in FIG. 1B so that the first mounting plate 31 and the second mounting plate 32 are arranged at positions not overlapping each other in the horizontal direction, the distance between the second and fourth joints 12 and 14 is longer than the distance between the first and third joints 11 and 13. For this reason, the length of the second link 22 is longer than the length of the first link 21.

Figure 1C:
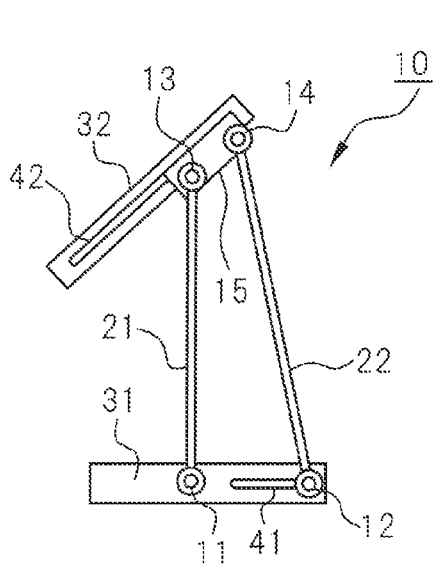
FIG. 1C is a side view which illustrates the state of the four-section articulated link mechanism which is illustrated in FIG. 1A when opened to the maximum.

In the four-section articulated link mechanism 10 of the first embodiment which is formed as explained above, as illustrated in FIG. 1B, the first mounting plate 31 and the second mounting plate 32 can be arranged at positions not overlapping each other in the horizontal direction. Further, as illustrated in FIG. 1C, in the state where the second joint 12 is positioned at the end of the first slide groove 41 and the slide block 15 is positioned at the end of the second slide groove 42, the second mounting plate 32 can be tilted with respect to the first mounting plate 31 by a predetermined angle. Furthermore, in the state which is illustrated in FIG. 1C, if the second joint 12 is made to approach the first joint 11 and the slide block 15 is made to move to the end at the opposite side of the second slide groove 42, the angle of the second mounting plate 32 to the first mounting plate 31 can be changed as illustrated in FIG. 1D.

Figure 1D:
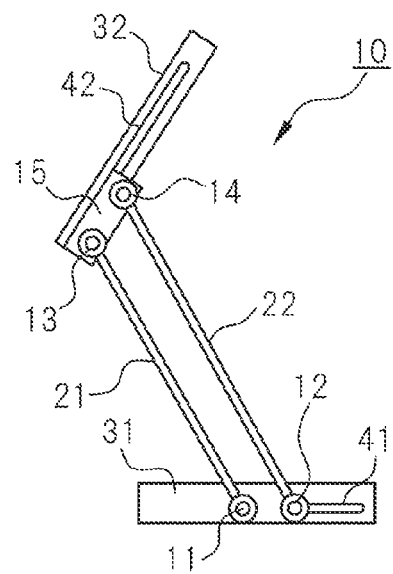
FIG. 1D is a side view which illustrates the state of the four-section articulated link mechanism which is illustrated in FIG. 1C with the joint slid.
Figure 2A:
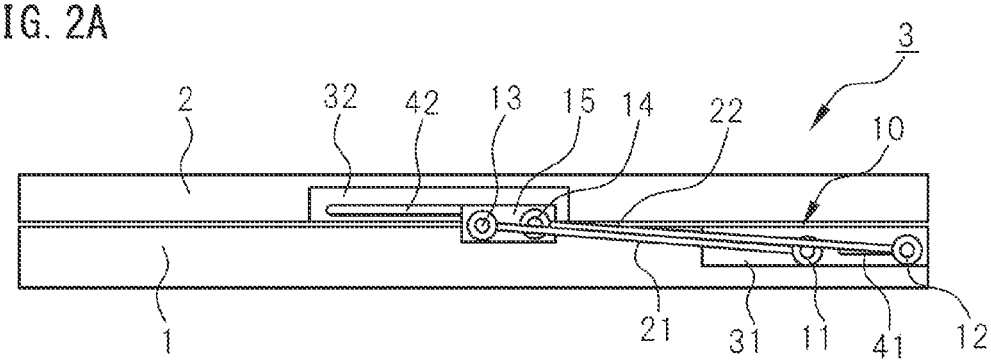
FIG. 2A is a side view which illustrates the closed state of the information apparatus where the four-section articulated link mechanism which is illustrated from FIG. 1A to FIG. 1D is attached to a main body and a display part.
Figure 2B:
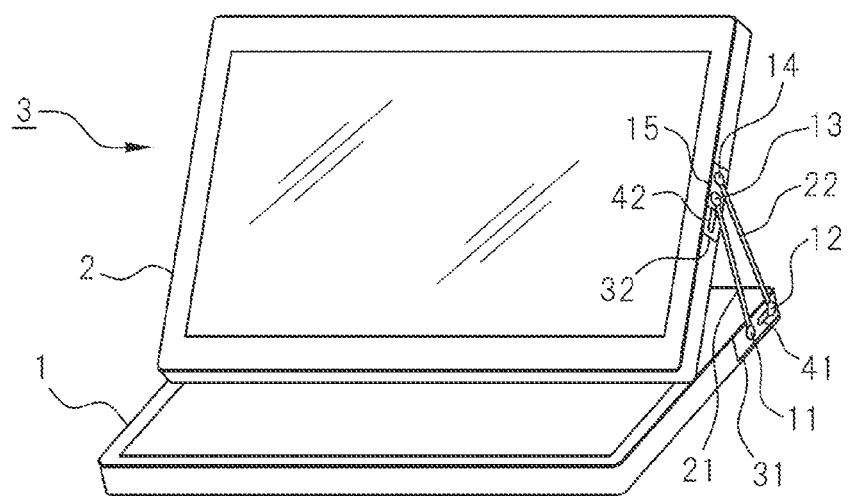
FIG. 2B is a perspective view which illustrates the state with the display part of the information apparatus which is illustrated in FIG. 2A slid and tilted with respect to the main body.
Figure 2C:
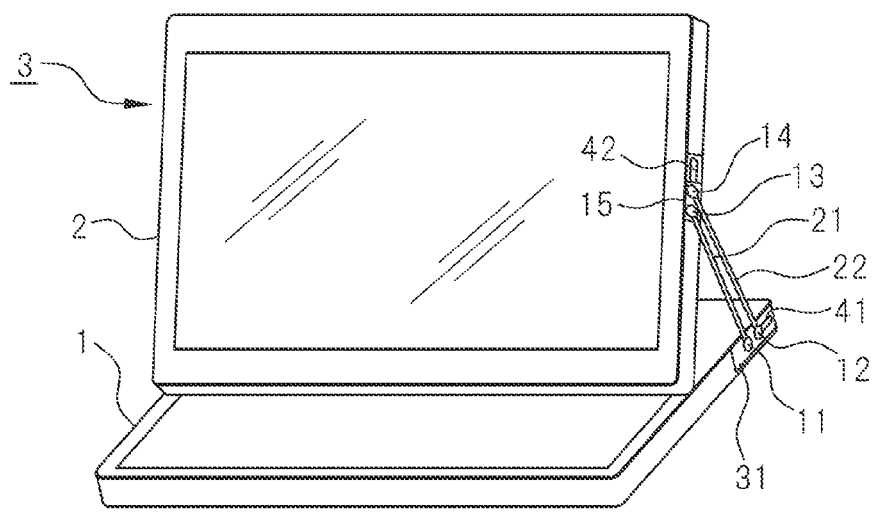
FIG. 2C is a perspective view which illustrates the state where the tilt angle of the display part of the information apparatus which is illustrated in FIG. 2B is changed.

FIG. 2A is a side view which illustrates the closed state of an information apparatus 3 where the four-section articulated link mechanism 10 which is illustrated from FIG. 1A to FIG. 1D is attached to the main body 1 and the display part 2. Four-section articulated link mechanisms 10 can also be attached to the two side surfaces of the information apparatus 3. FIG. 2B is a perspective view which illustrates the state where the display part 2 of the information apparatus 3 which is illustrated in FIG. 2A is slid and tilted with respect to the main body 1. In the state which is illustrated in FIG. 2B, the four-section articulated link mechanism 10 which is attached to the information apparatus 3 becomes the state which is illustrated in FIG. 1C. FIG. 2C is a perspective view which illustrates the state of changing the tilt angle of the display part 2 of the information apparatus 3 which is illustrated in FIG. 2B to increase the tilt angle. In the state which is illustrated in FIG. 2C, the four-section articulated link mechanism 10 which is attached to the information apparatus 3 is in the state which is illustrated in FIG. 1D.

Figure 3A:
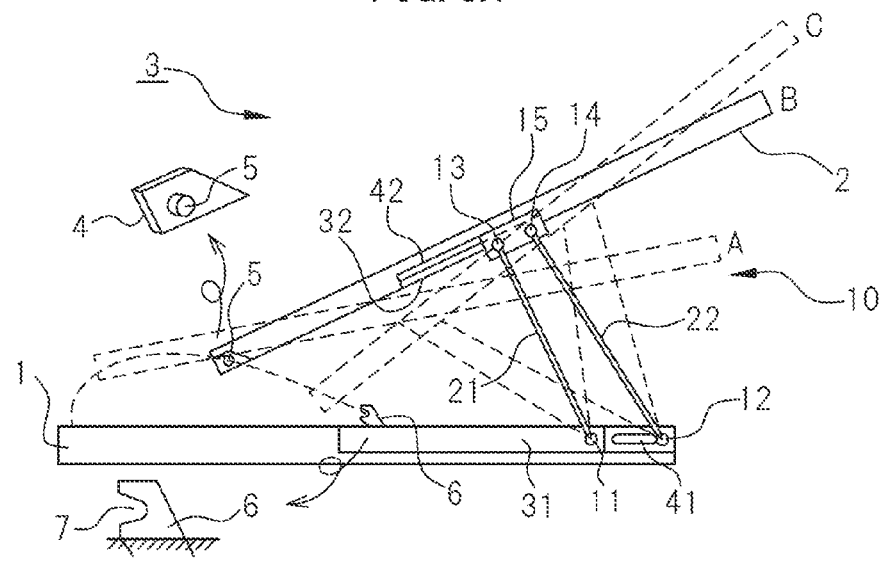
FIG. 3A is a side view which illustrates the operation until the information apparatus in the state which is illustrated in FIG. 2A reaches the state which is illustrated in FIG. 2B.

Here, the operation by which the display part 2 of the information apparatus 3 which is illustrated in FIG. 2A is slid and tilted with respect to the main body 1 and reaches the state which is illustrated in FIG. 2B and the operation by which it reaches the state which is illustrated in FIG. 2C from the state which is illustrated in FIG. 2B will be explained in detail using FIGS. 3A to 3C. As illustrated in FIG. 3A, rotary shaft bases 4 are provided at the two sides of the bottom end part of the display part 2. Rotary shafts 5 are provided sticking out from the rotary shaft bases 4. The rotary shafts 5 at the two sides of the bottom end part of the display part 2 are provided to become coaxial. On the other hand, on the top surface of the main body 1, at portions where the rotary shafts 5 are positioned when the display part 2 is slid and tilted by the four-section articulated link mechanism 10 and the bottom end part of the display part 2 reaches the top surface of the main body 1, brackets 6 are provided which receive and lock the rotary shafts 5. The brackets 6 are provided with rotary shaft support recesses 7 which enable the rotary shafts 5 to be rotated after the rotary shafts 5 are received.

When opening the display part 2 of the information apparatus 3 in the closed state from the main body 1, due to the function of the four-section articulated link mechanism 10, the rotary shafts 5 which are positioned at the two sides of the bottom end part of the display part 2 move on the paths which are illustrated by the broken line in FIG. 3A. That is, the display part 2 is moved from the closed state through the position A which is illustrated by the broken line in FIG. 3A to reach the position B which is illustrated by the solid line (four-section articulated link mechanism 10 in state illustrated in FIG. 1A) and, furthermore, is moved through the position C which is illustrated by the broken line to reach the position which is illustrated in FIG. 3B. The state of the four-section articulated link mechanism 10 in FIG. 3B is the state which is illustrated in FIG. 1C. The movement of the display part 2 with respect to the main body 1 at this time is movement combining a slide and tilt operation with respect to the main body 1 and is smooth compared with the conventional operation of sliding and tilting.

Figure 3B:
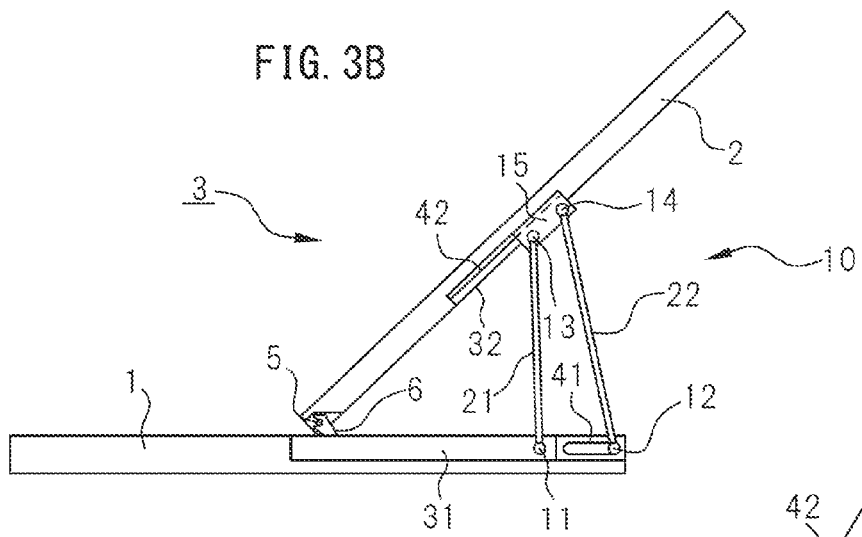
FIG. 3B is a side view of an information apparatus which is illustrated in FIG. 2B.
Figure 3C:
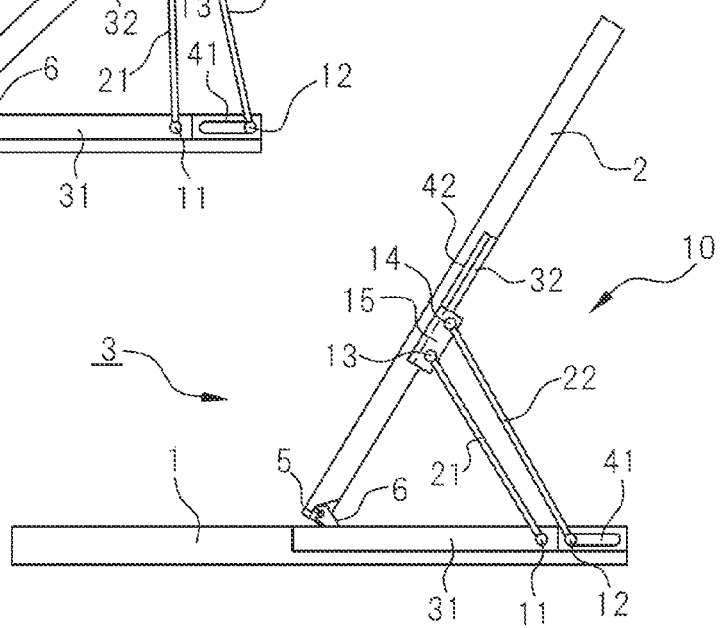
FIG. 3C is a side view of an information apparatus which is illustrated in FIG. 2C.

In the state which is illustrated in FIG. 3B, the rotary shafts 5 which are at the bottom end part of the display part 2 are inside the rotary shaft support recesses 7 of the brackets 6, so the display part 2 can be rotated around the rotary shafts 5. When making the display part 2 rotate about the rotary shafts 5 which are held at the brackets 6, the second joint 12 is made to slide inside the first slide groove 41 to make it approach the first joint 11 and the slide block 15 is made to slide through the second slide groove 42. By making the four-section articulated link mechanism 10 operate in this way, the information apparatus 3 is in a state tilted to the maximum extent which is illustrated in FIG. 3C. The state of the four-section articulated link mechanism 10 in FIG. 3C is the state which is illustrated in FIG. 1D.

Next, a four-section articulated link mechanism 10 of a second embodiment of the present application will be explained. The four-section articulated link mechanism of the first embodiment is designed to be attached to each of the two side surfaces of the information apparatus. On the other hand, the four-section articulated link mechanism 10 of the second embodiment is attached between the top surface of the main body of the information apparatus and the back surface of the display part. For this reason, the shapes of the members which configure the four-section articulated link mechanism 10 of the second embodiment differ from the four-section articulated link mechanism of the first embodiment, but the functions are the same as the members which configure the first embodiment. Therefore, the members which have the same functions as the first embodiment among the members which configure the four-section articulated link mechanism 10 of the second embodiment will be explained while being assigned the same reference notations as the first embodiment.

Figure 4:
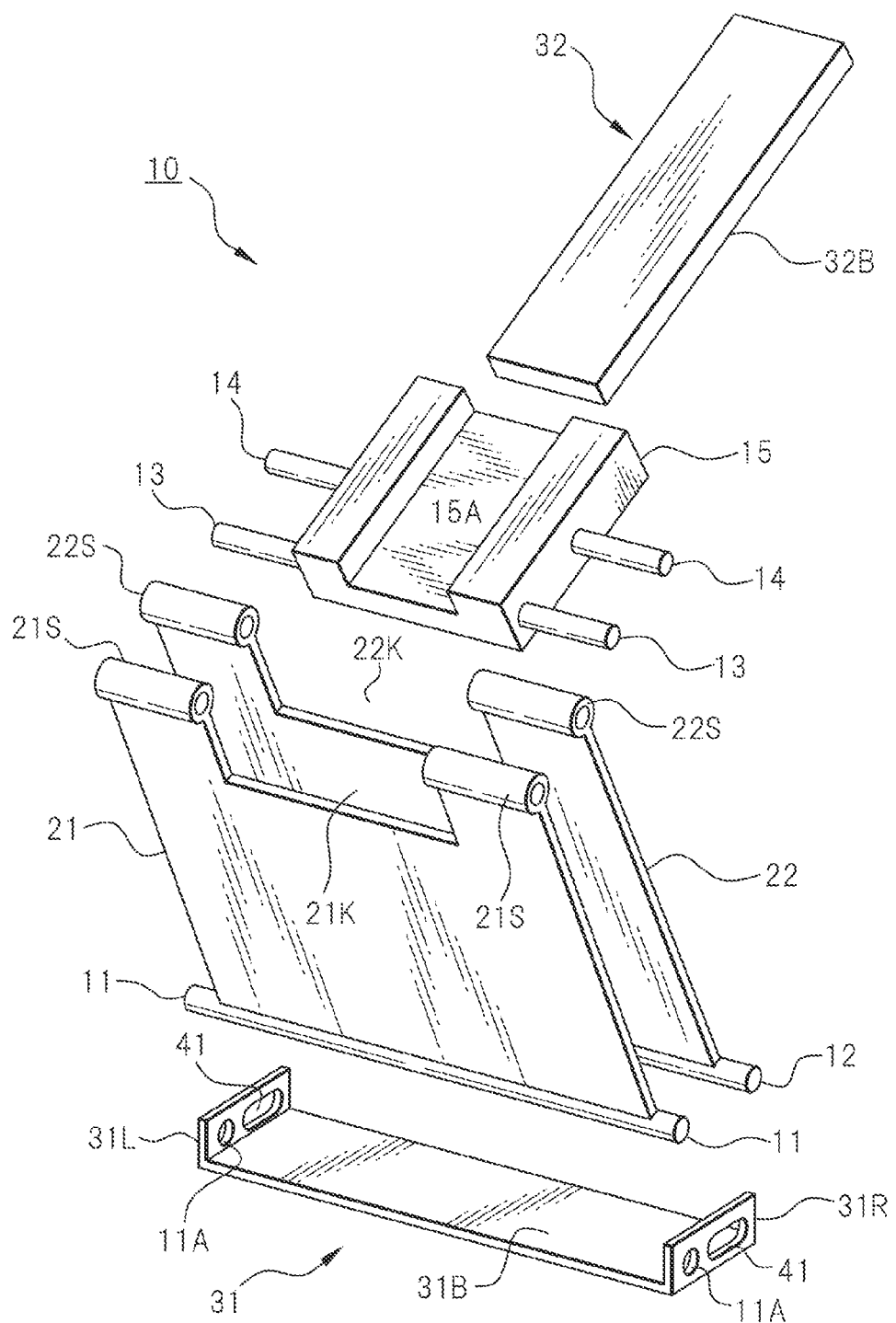
FIG. 4 is a disassembled perspective view which illustrates the configuration of a second embodiment of a four-section articulated link mechanism according to the present application.

FIG. 4 is a disassembled perspective view which illustrates the configuration of the four-section articulated link mechanism 10 of the second embodiment according to the present application. In the second embodiment, a first mounting plate 31 is provided with a first base plate 31B which is set on the top surface of the main body 1 and with joint mounting plates 31L and 31R which are provided at the left and right ends of the first base plate 31B in directions vertical to the first base plate 31B. The joint mounting plates 31L and 31R are provided with holes 11A for attachment of a first joint 11 and first slide grooves 41. Further, a second mounting plate 32 is provided with a second base plate 32B which is set at the back surface of the display part 2.

A slide block 15 in the second embodiment is a block shape. It is provided with a recess 15A at its top part. The second base plate 32B is fit in this recess 15A. Due to this configuration, the slide block 15 can slide with respect to the second base plate 32B. Further, at the side surfaces of the two sides of the slide block 15, rod-shaped third joints 13 and fourth joints 14 are provided sticking out.

Further, the first joint 11 is shaped as a rod which runs through and rotates in the two holes 11A at the joint mounting plates 31L and 31R at its two ends. A first link 21 is connected to this rod-shaped first joint 11. Therefore, the first link 21 is plate shaped or is frame shaped provided with a space at its inside. Further, at the top end of the first link 21, sleeves 21S are provided which are inserted over third joints 13 of the slide block 15 and by which the first link 21 can rotate with respect to the third joints 13. Furthermore, at the top end of the first link 21, there is a cutaway part 21K for preventing the first link 21 from striking the slide block 15.

Similarly, a second joint 12 is shaped as a rod which runs through the two first slide grooves 41 at the joint mounting plates 31L and 31R at its two ends and slides inside the first slide grooves 41. A second link 22 is connected to this rod-shaped second joint 12 in the same way as the first link 21. The second link 22 is also plate shaped or is frame shaped provided with a space at its inside. Further, at the top end of the second link 22, sleeves 22S are provided which are inserted over fourth joints 14 of the slide block 15 and by which the second link 22 can rotate with respect to the fourth joints 14. Furthermore, at the top end of the second link 22, there is similarly a cutaway part 22K for preventing the second link 22 from striking the slide block 15.

Note that, the four-section articulated link mechanism 10 of the second embodiment which is illustrated in FIG. 4 illustrates the members of the four-section articulated link mechanism 10 in the second embodiment. Their assembly will not be alluded to. Further, in the embodiments which are explained later, the specific shapes in the case of assembling the four-section articulated link mechanism 10 of the second embodiment which is illustrated in FIG. 4 in an actual information apparatus 3 are illustrated. In detailed parts, there are parts which do not match the four-section articulated link mechanism 10 of the second embodiment which is illustrated in FIG. 4.

Figure 5A:
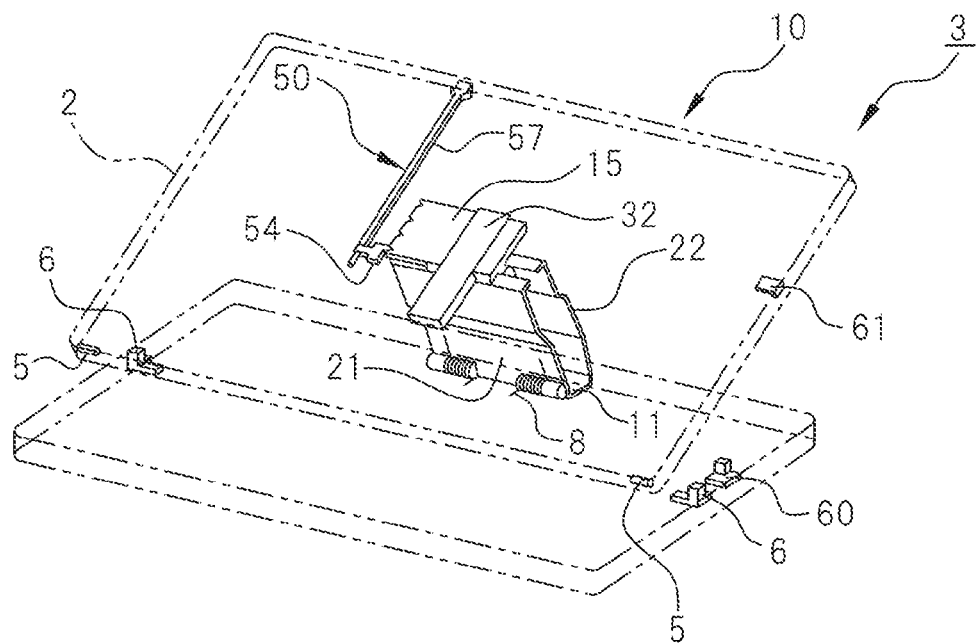
FIG. 5A is a perspective view which illustrates the position of the four-section articulated link mechanism in the case where a specific example of the four-section articulated link mechanism of the second embodiment which is illustrated in FIG. 4 is attached to an information apparatus which is provided with a main body and a display part.

FIG. 5A is a perspective view which shows the position of a four-section articulated link mechanism 10 in the case where a specific example of the four-section articulated link mechanism 10 of the second embodiment which is illustrated in FIG. 4 is attached to the information apparatus 3 which is provided with the main body 1 and the display part 2. The main body 1 and the display part 2 are illustrated in a skeleton shape using two-dot chain lines. At the bottom end part of the display part 2, rotary shafts 5 are provided. The main body 1 is provided with brackets 6 which receive the rotary shafts 5.

Furthermore, at the main body 1, there is a closing lock mechanism 60 for holding the closed state when the display part 2 is laid over the main body 1. At the portion corresponding to the closing lock mechanism 60 of the display part 2, a lock claw 61 is provided. For the closing lock mechanism 60, a known mechanism can be employed, so here the explanation of this mechanism will be omitted.

In the four-section articulated link mechanism 10 of the second embodiment which is illustrated in FIG. 5A, between the first joint 11 and the first link 21, a spring member 8 is provided which gives a bias force to the first link 21 in a direction where the angle formed by the main body 1 and the first link 21 becomes larger. If the above-mentioned closing lock mechanism 60 is released in the closed state where the display part 2 is laid over the main body 1, this spring member 8 causes the display part 2 to open smoothly from the main body 1.

Furthermore, the four-section articulated link mechanism 10 of the second embodiment which is illustrated in FIG. 5A is provided with a tilt angle setting mechanism 50 which enables change of the tilt angle of the display part 2 with respect to the main body 1. The tilt angle setting mechanism 50 uses the lock release lever 57 to change the engagement position of the lock plate 54 and the slide block 15 and thereby change the tilt angle of the display part 2 with respect to the main body 1, but this mechanism will be explained later.

Figure 5B:
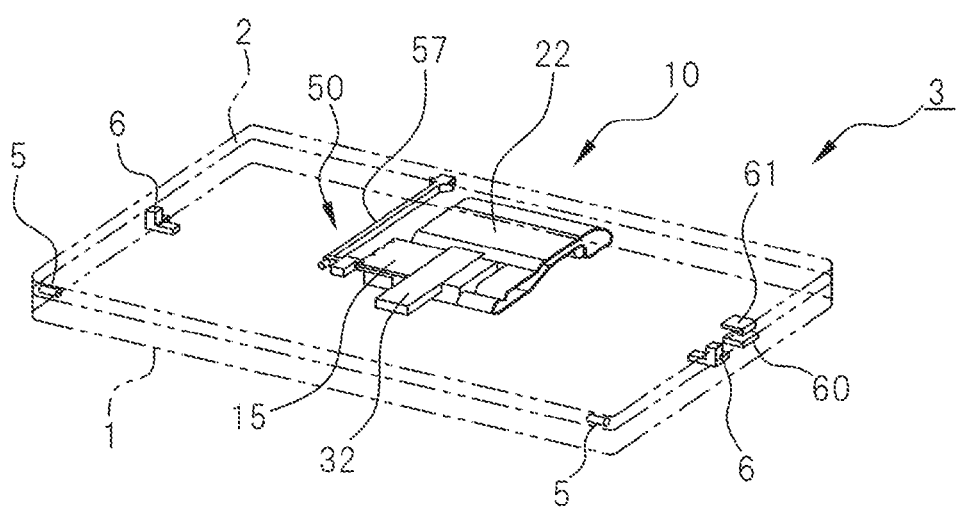
FIG. 5B is a perspective view which illustrates the state of a four-section articulated link mechanism at the time when the information apparatus which is illustrated in FIG. 5A is closed.

FIG. 5B is a perspective view which illustrates the state of the four-section articulated link mechanism 10 at the time when the information apparatus 3 of FIG. 5A is closed. In this state, the closing lock mechanism 60 is used to lay the display part 2 over the main body 1 and hold the closed state.

FIG. 6A is a perspective view which illustrates the state of the four-section articulated link mechanism 10 at the time when an information apparatus 3 in the state which is illustrated in FIG. 5A finishes being slid and tilted. In this state, the rotary shaft 5 at the bottom end part of the display part 2 is rotatably supported by the brackets 6 at the main body 1. Further, FIG. 6B is a perspective view which illustrates the state of the four-section articulated link mechanism 10 at the time when the tilt angle of the display part 2 of the information apparatus 3 is changed from the state which is illustrated in FIG. 6A. In this state, the tilt angle setting mechanism 50 is used to change the engagement position of the lock plate 54 and the slide block 15 from the state which is illustrated in FIG. 6A.

Figure 7A:
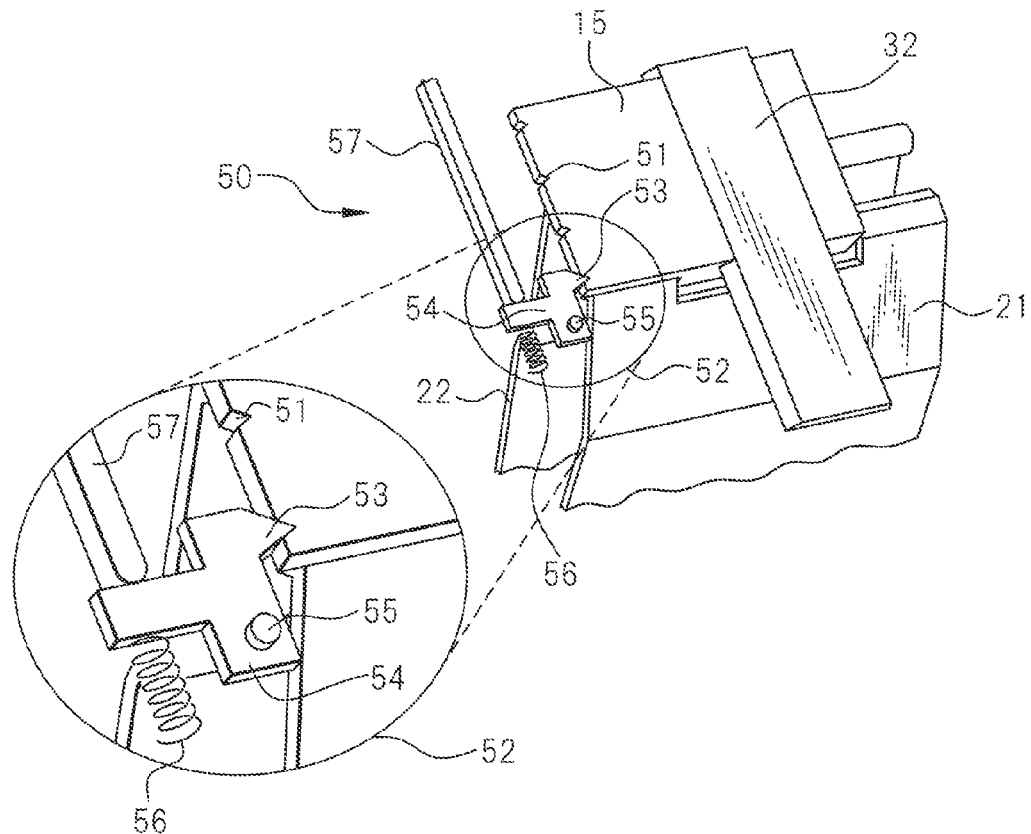
FIG. 7A is a partially enlarged perspective view which illustrates principal parts of the four-section articulated link mechanism which is illustrated in FIG. 6A.

FIG. 7A is a partially enlarged perspective view of the four-section articulated link mechanism 10 which is illustrated in FIG. 6A and illustrates the configuration of the tilt angle setting mechanism 50. The tilt angle setting mechanism 50 is provided with a plurality of tilt angle setting grooves 51 which are provided at the side surface of the slide block 15 and a lock lever mechanism 52 which is provided at the display part 2 and engages with a tilt angle setting groove 51. Tilt angle setting grooves 51 are provided at predetermined intervals in the side surface of the slide block 15. The lock lever mechanism 52 is provided with a lock plate 54 which is provided with a claw member 53 which engages with a tilt angle setting groove 51, a rotary shaft 55 which rotatably supports the lock plate 54, and a spring member 56 which gives a bias force to the lock plate 54 so that the claw member 53 engages with a tilt angle setting groove 51.

The lock lever mechanism 52 is further provided with a lock release lever 57 which makes the lock plate 54 rotate in a direction where the engagement of the claw member 53 and a tilt angle setting groove 51 is released. The lock release lever 57, as illustrated in FIGS. 5A and 5B and FIGS. 6A and 6B, is extended to the top end side of the display part 2. Therefore, if pushing the lock release lever 57 at the top end side of the display part 2, the lock plate 54 rotates against the bias force of the spring member 56 and the claw member 53 and the tilt angle setting groove 51 disengage. Accordingly, it is possible to push the lock release lever 57 while making the display part 2 rotate.

Figure 7B:
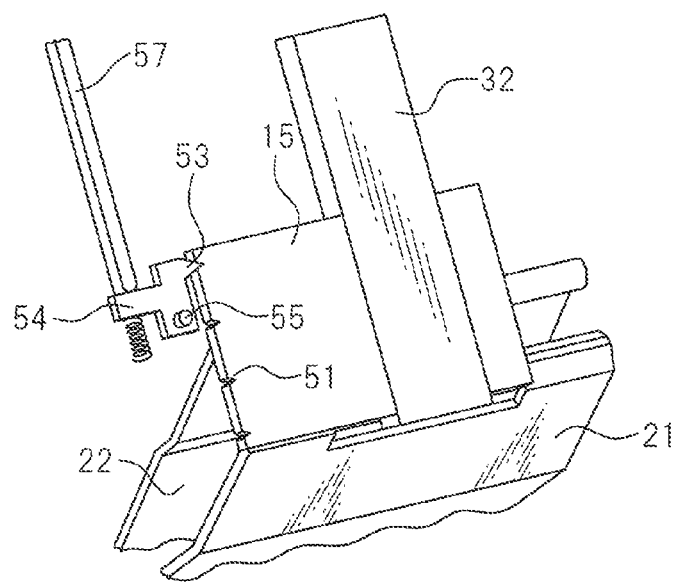
FIG. 7B is a partially enlarged perspective view which illustrates principal parts of the four-section articulated link mechanism which is illustrated in FIG. 6B.
Figure 8A:
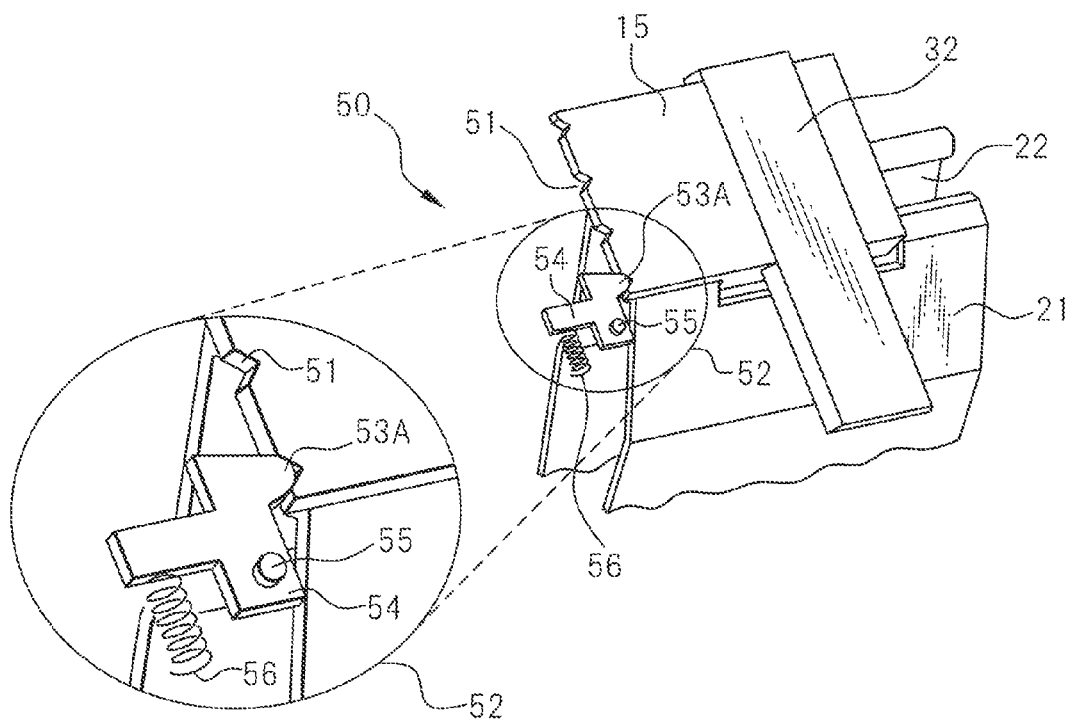
FIG. 8A is a partially enlarged perspective view which illustrates a modified embodiment of the same portion as in FIG. 7A.
Figure 8B:
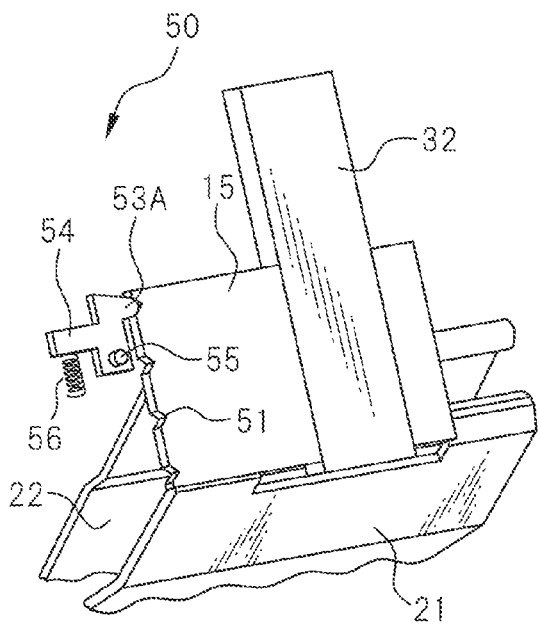
FIG. 8B is a partially enlarged perspective view of the same portion as in FIG. 7B which illustrates the operation of a tilt angle changing part of the four-section articulated link mechanism which is illustrated in FIG. 8A.

FIG. 7B is a partially enlarged perspective view of the four-section articulated link mechanism 10 which is illustrated in FIG. 6B and illustrates the state where the claw member 53 is engaged with the tilt angle setting groove 51 at the upper side of the slide block 15. In the embodiment which is illustrated in FIGS. 7A and 7B, the tilt angle setting grooves 51 are V-shaped grooves and the claw member 53 is a wedge shape, but the claw member 53 can be made a claw member 53A with a front end part made a rounded shape as illustrated in FIG. 8A. FIG. 8B is a partially enlarged perspective view of the same portion as FIG. 7B in the tilt angle setting mechanism 50 which is provided with the claw member 53A which is illustrated in FIG. 8A.

Figure 8C:
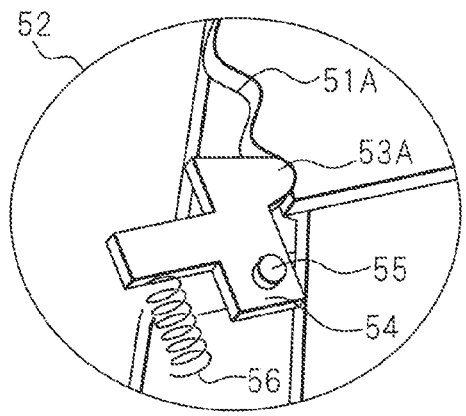
FIG. 8C is a partially enlarged perspective view which illustrates a further modified embodiment of a tilt angle changing part which is illustrated in FIG. 8A.

Furthermore, the tilt angle setting mechanism 50 which is provided with the claw member 53A which is illustrated in FIG. 8A, as illustrated in FIG. 8C, may also be provided with grooves 51A comprised of rounded tilt angle setting grooves 51. Further, in a tilt angle setting mechanism 50 where the tilt angle setting grooves 51 are made rounded grooves 51A and a rounded shaped claw member 53A is made to engage with them, it is possible to make the display part 2 tilt without using a lock release lever 57. That is, if a predetermined external force or more is applied to the rounded shapes of the tilt angle setting groove 51A and claw member 53A in the longitudinal direction of the slide block 15, the claw member 53A and the groove 51A can be disengaged.

Figure 9A:
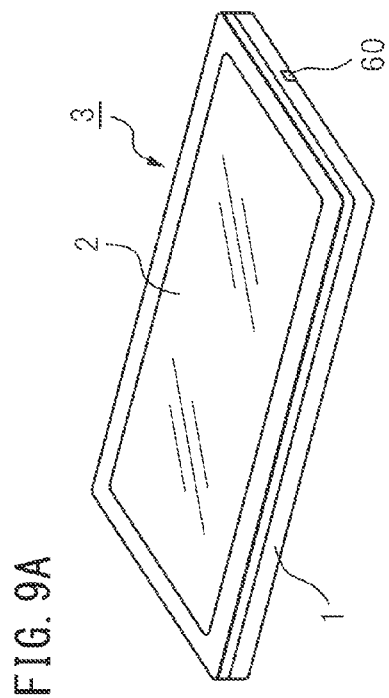
FIG. 9A is a perspective view which illustrates the state of an information apparatus at the time when the four-section articulated link mechanism is in the state which is illustrated in FIG. 5B.
Figure 9B:
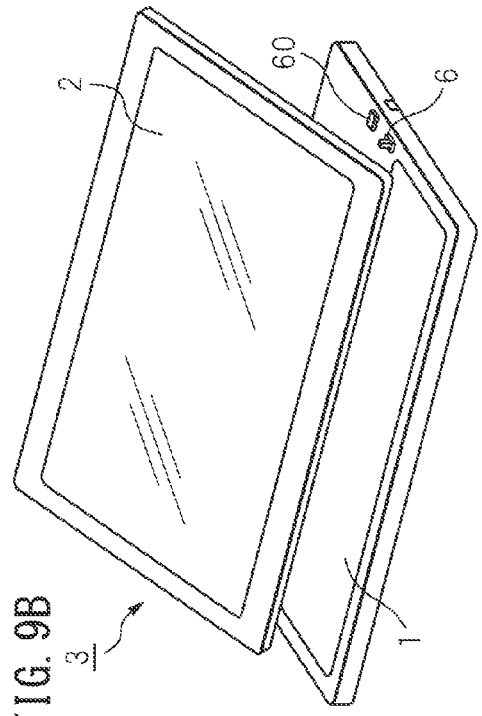
FIG. 9B is a perspective view which illustrates the state of an information apparatus at the time when the four-section articulated link mechanism is in the state which is illustrated in FIG. 5A.
Figure 9C:
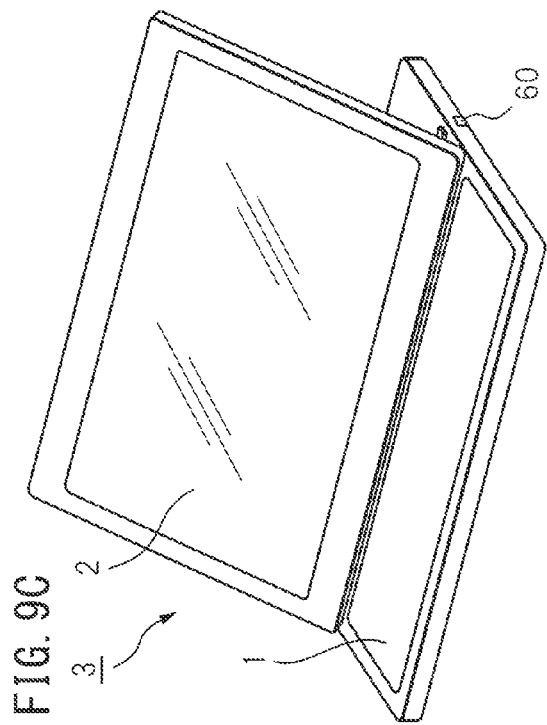
FIG. 9C is a perspective view which illustrates the state of an information apparatus at the time when the four-section articulated link mechanism is in the state which is illustrated in FIG. 6A.
Figure 9D:
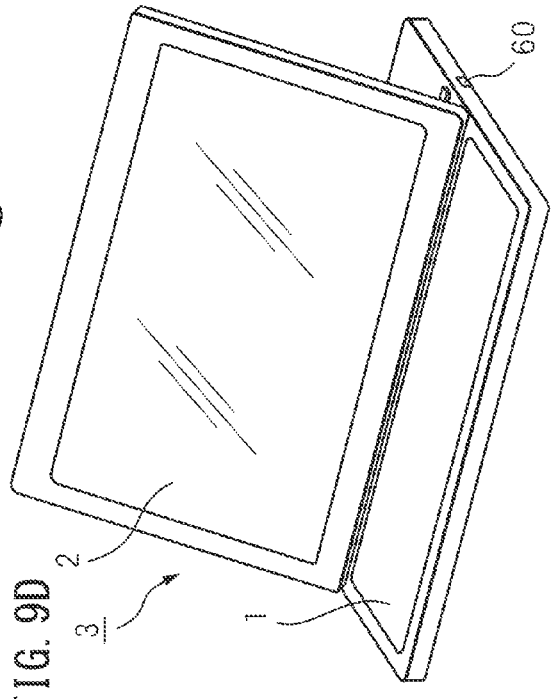
FIG. 9D is a perspective view which illustrates the state of an information apparatus at the time when the four-section articulated link mechanism is in the state which is illustrated in FIG. 6B.

According to the four-section articulated link mechanism of the present application which is explained above, it is possible to make the display part 2 which is illustrated in FIG. 9C smoothly shift from the closed state of the information apparatus 3 which is illustrated in FIG. 9A through the state which is illustrated in FIG. 9B to a tilted state. Furthermore, the tilt angle of the display part 2 which is provided with the predetermined tilt angle which is illustrated in FIG. 9C can be changed as illustrated in FIG. 9D. Further, the back surface of the display part 2 is supported by two links, so when the display part is a touch panel, the display part does not shake even when the touch panel is operated in a tilted state.

Note that, the four-section articulated link mechanism in the information apparatus 3 which is illustrated in FIG. 9A is in the state which is illustrated in FIG. 5B, while the four-section articulated link mechanism in the information apparatus 3 which is illustrated in FIG. 9B is in the state which is illustrated in FIG. 5A. Furthermore, the four-section articulated link mechanism in the information apparatus 3 which is illustrated in FIG. 9C is in the state which is illustrated in FIG. 6A, while the four-section articulated link mechanism in the information apparatus 3 which is illustrated in FIG. 9D is in the state which is illustrated in FIG. 6B.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. An information apparatus which is provided with
   a first housing,
   a second housing, and
   a four-section articulated link mechanism which links the first housing and the second housing,
   the four-section articulated link mechanism being provided with:
   first and second joints which are provided at the first housing and
   third and fourth joints which are provided at the second housing,
   the first joint is fixed in position, while the second joint can slide with respect to the first joint,
   the third and fourth joints are positioned at two ends of a slide block which can slide on the second housing,
   a rotary shaft is provided at the second housing at an end of the first housing side at the opened position, and
   a support part which rotatably supports the rotary shaft is provided at the first housing at a position of the rotary shaft of the second housing at the opened position,
   the four-section articulated link mechanism able to change the positions of the four joints so as to change the first and second housings to any of the positions of a closed position where the second housing is laid over the first housing, an opened position after the second housing is slid from the closed position, then is arranged forming a certain tilt angle with respect to the first housing, and a plurality of open angle positions where the tilt angle of the second housing with respect to the first housing is changed from the opened position.

2. The information apparatus according to claim 1, wherein the slide block is provided with a tilt angle setting mechanism for setting in stages a tilt angle from the opened position of the second housing and of the second housing with respect to the first housing, the tilt angle setting mechanism being provided with:
   a plurality of tilt angle setting grooves which are provided at a side surface of the slide block and
   a lock lever mechanism which is provide at the second housing and which engages with a the tilt angle setting groove.

3. The information apparatus according to claim 2, wherein the lock lever mechanism is provided with:
   a lock plate which is provided with a claw member which engages with a the tilt angle setting groove,
   a rotary shaft which rotatably supports the lock plate, and
   a spring member which gives a bias force to the lock plate so that the claw member engages with a the tilt angle setting groove.

4. The information apparatus according to claim 3, wherein the lock lever mechanism is further provided with a lock release lever which makes the lock plate rotate in a direction whereby engagement of the claw member and the tilt angle setting groove is released.

5. The information apparatus according to claim 3, wherein the tilt angle setting grooves are rounded grooves, while the claw member is a rounded projection which engages with a the tilt angle setting groove, and
   the rounded shapes of the tilt angle setting grooves and the claw member are shapes where, when a predetermined external force or more is applied in a longitudinal direction of the slide block, the claw member and the tilt angle setting groove disengage.

6. The information apparatus according to claim 1, wherein
   a first link bridges the first and third joints,
   a second link bridges the second and fourth joints, and
   the second link is longer than the first link.

7. The information apparatus according to claim 6, wherein the four-section articulated link mechanism is provided with a spring member which gives bias force which makes the second housing move from the closed position in a direction of the opened position.

8. The information apparatus according to claim 6, wherein the first housing is provided with a closing lock mechanism which holds the second housing in the closed position.

9. The information apparatus according to claim 8, wherein the four-section articulated link mechanism links the first housing and the second housing at side surfaces of the first housing and the second housing.

10. The information apparatus according to claim 8, wherein
    the four-section articulated link mechanism is provided between a top surface of the first housing and a back surface of the second housing and link the first housing and the second housing.

11. The information apparatus according to claim 1, wherein
    the four-section articulated link mechanism is provided with a spring member which gives bias force which makes the second housing move from the closed position in a direction of the opened position.

12. The information apparatus according to claim 1, wherein
    the four-section articulated link mechanism links the first housing and the second housing at side surfaces of the first housing and the second housing.

13. The information apparatus according to claim 8, wherein the four-section articulated link mechanism is provided between a top surface of the first housing and a back surface of the second housing and link the first housing and the second housing.

14. A link mechanism which is attached to an information apparatus according to claim 1, wherein
a first link bridges the first and third joints,
a second link bridges the second and fourth joints,
a slide block to the two ends of which the third and fourth joints are attached is provided,
the first joint is fixed in position on the first housing,
the second joint can be slid with respect to the first joint,
the slide block can slide on the second housing, and
the second link is longer than the first link.

15. The link mechanism according to claim 14, wherein
a first mounting plate to the first housing and a second mounting plate to the second housing are provided,
the first joint is fixed in position on the first mounting plate,
the second joint is attached slidably to a first slide groove which is provided at the first mounting plate, and
the slide block is attached slidably to a second slide groove which is provided at the second mounting plate.

16. The link mechanism according to claim 15, wherein
the first mounting plate is provided with a first base plate which is set on a top surface of the first housing and joint mounting plates which are provided at left and right ends of the first base plate in a direction vertical to the first base plate,
the second mounting plate is provided with a second base plate which is set on a back surface of the second housing,
the first joint is fixed in position on the joint mounting plates,
the second joint is attached slidably with respect to the first joint inside the first slide grooves which are provided at the joint mounting plates,
the slide block can slide with respect to the second base plate and the third and fourth joints are provided at left and right ends of the same,
the first link is a frame shape or plate shape, the first joint being provided at the two ends of its bottom end, two top ends of the same being engaged with the third joints, and
the second link is a frame shape or plate shape, the second joint being provided at its two bottom ends, two top ends of the same being engaged with the fourth joints.

17. The link mechanism according to claim 16, wherein
between the first joint and the first link, a spring member is provided which gives a bias force to the first link in a direction where an angle formed by the first housing and the first link becomes larger.

* * * * *